United States Patent
Sherrer et al.

(10) Patent No.: US 9,337,152 B2
(45) Date of Patent: May 10, 2016

(54) FORMULATION FOR PACKAGING AN ELECTRONIC DEVICE AND ASSEMBLIES MADE THEREFROM

(71) Applicant: Nuvotronics, LLC, Radford, VA (US)

(72) Inventors: David William Sherrer, Radford, VA (US); James D MacDonald, Chandler, AZ (US)

(73) Assignee: Nuvotronics, Inc, Radford, VA (US)

( * ) Notice: Subject to any disclaimer, the term of this patent is extended or adjusted under 35 U.S.C. 154(b) by 104 days.

(21) Appl. No.: 13/843,505

(22) Filed: Mar. 15, 2013

(65) Prior Publication Data

US 2014/0268625 A1    Sep. 18, 2014

(51) Int. Cl.
| | |
|---|---|
| *B32B 18/00* | (2006.01) |
| *H01L 23/29* | (2006.01) |
| *H01L 23/552* | (2006.01) |
| *H05K 5/00* | (2006.01) |
| *H05K 9/00* | (2006.01) |
| *H01L 23/31* | (2006.01) |
| *H01L 23/66* | (2006.01) |
| *H01L 23/24* | (2006.01) |
| *H01L 23/00* | (2006.01) |

(52) U.S. Cl.
CPC ............ *H01L 23/552* (2013.01); *H01L 23/295* (2013.01); *H01L 23/3135* (2013.01); *H01L 23/66* (2013.01); *H05K 5/0095* (2013.01); *H05K 9/0024* (2013.01); *H01L 23/24* (2013.01); *H01L 24/16* (2013.01); *H01L 24/32* (2013.01); *H01L 24/48* (2013.01); *H01L 24/49* (2013.01); *H01L 24/73* (2013.01); *H01L 2223/6611* (2013.01); *H01L 2223/6627* (2013.01); *H01L 2224/16225* (2013.01); *H01L 2224/32225* (2013.01); *H01L 2224/32245* (2013.01); *H01L 2224/48227* (2013.01); *H01L 2224/48247* (2013.01); *H01L 2224/49109* (2013.01); *H01L 2224/73265* (2013.01); *H01L 2924/15156* (2013.01); *H01L 2924/16195* (2013.01); *H01L 2924/181* (2013.01); *H01L 2924/19041* (2013.01); *H01L 2924/19043* (2013.01); *H01L 2924/19105* (2013.01)

(58) Field of Classification Search
CPC ... H01L 23/552; H05K 5/0095; H05K 9/0024
USPC ................ 257/680, 704, 728, 788, 790, 789; 428/308, 4, 313.3, 313.9, 320.2, 323, 428/325
See application file for complete search history.

(56) References Cited

U.S. PATENT DOCUMENTS

| | | | | |
|---|---|---|---|---|
| 4,141,055 A | * | 2/1979 | Berry ................. | H01L 23/5381 257/786 |
| 4,293,519 A | * | 10/1981 | Knappenberger et al. ....................... | 264/272.13 |

(Continued)

OTHER PUBLICATIONS

Chance, G.I. et al., "A suspended-membrane balanced frequency doubler at 200GHz," 29th International Conference on Infrared and Millimeter Waves and Terahertz Electronics, pp. 321-322, Karlsrube, 2004.

(Continued)

*Primary Examiner* — David Sample
*Assistant Examiner* — Nicholas W Jordan
(74) *Attorney, Agent, or Firm* — Niels Haun; Dann, Dorfman, Herrell and Skillman, P.C.

(57) ABSTRACT

Disclosed and claimed herein is a formulation for packaging an electronic device and assemblies made therefrom.

2 Claims, 2 Drawing Sheets

(56) References Cited

U.S. PATENT DOCUMENTS

| | | | |
|---|---|---|---|
| 5,276,414 A * | 1/1994 | Fujimoto et al. | 333/246 |
| 5,488,015 A | 1/1996 | Havemann | |
| 5,838,551 A * | 11/1998 | Chan | 361/818 |
| 6,281,574 B1 * | 8/2001 | Drake et al. | 257/706 |
| 6,383,660 B2 * | 5/2002 | Igarashi | 428/620 |
| 6,423,566 B1 | 7/2002 | Feger | |
| 6,562,448 B1 * | 5/2003 | Chamberlain | C08K 9/02 428/312.6 |
| 6,713,867 B2 | 3/2004 | Mannak | |
| 6,909,176 B1 | 6/2005 | Wang | |
| 6,995,470 B2 | 2/2006 | Ahn | |
| 7,091,611 B2 | 8/2006 | Ahn | |
| 7,262,369 B1 * | 8/2007 | English | 174/370 |
| 7,585,702 B1 | 9/2009 | Wang | |
| 8,164,815 B2 | 4/2012 | Londergan | |
| 8,517,275 B2 | 8/2013 | Tsuchiya | |
| 8,969,132 B2 | 3/2015 | Sherrer | |
| 2002/0166687 A1 * | 11/2002 | Tornovist | H01L 23/295 257/E23.121 |
| 2003/0013284 A1 | 1/2003 | Emrick | |
| 2003/0080442 A1 | 5/2003 | Unger | |
| 2003/0107128 A1 * | 6/2003 | Mannak | H01L 23/295 257/728 |
| 2004/0149686 A1 | 8/2004 | Zhang | |
| 2012/0067871 A1 | 3/2012 | Sherrer | |
| 2012/0249375 A1 | 10/2012 | Heino | |
| 2012/0299003 A1 | 11/2012 | Yamazaki | |

OTHER PUBLICATIONS

Immorlica, Jr., T. et al., "Miniature 3D micro-machined solid state power amplifiers," COMCAS 2008.

Ehsan, N. et al., "Microcoaxial lines for active hybrid-monolithic circuits," 2009 IEEE MTT-S Int. Microwave.Symp. Boston, MA, Jun. 2009.

Filipovic, D. et al., "Monolithic rectangular coaxial lines. Components and systems for commercial and defense applications," Presented at 2008 IASTED Antennas, Radar, and Wave Propagation Conferences, Baltimore, MD, USA, Apr. 2008.

Filipovic, D.S., "Design of microfabricated rectangular coaxial lines and components for mm-wave applications," Microwave Review, vol. 12, No. 2, Nov. 2006, pp. 11-16.

Ingram, D.L. et al., "A 427 mW 20% compact W-band InP HEMT MMIC power amplifier," IEEE RFIC Symp. Digest 1999, pp. 95-98.

Lukic, M. et al., "Surface-micromachined dual Ka-band cavity backed patch antennas," IEEE Trans. AtennasPropag., vol. 55, pp. 2107-2110, Jul. 2007.

Oliver, J.M. et al., "A 3-D micromachined W-band cavity backed patch antenna array with integrated rectacoax transition to wave guide," 2009 Proc. IEEE International Microwave Symposium, Boston, MA 2009.

Rollin, J.M. et al., "A membrane planar diode for 200GHz mixing applications," 29th International Conference on Infrared and Millimeter Waves and Terahertz Electronics, pp. 205-206, Karlsrube, 2004.

Rollin, J.M. et al., "Integrated Schottky diode for a sub-harmonic mixer at millimetre wavelengths," 31st International Conference on Infrared and Millimeter Waves and Terahertz Electronics, Paris, 2006.

Saito et al., "Analysis and design of monolithic rectangular coaxial lines for minimum coupling," IEEE Trans. Microwave Theory Tech., vol. 55, pp. 2521-2530, Dec. 2007.

Vanhille, K. et al., 'Balanced low-loss Ka-band -coaxial hybrids,' IEEE MTT-S Dig., Honolulu, Hawaii, Jun. 2007.

Vanhille, K. et al., "Ka-Band surface mount directional coupler fabricated using micro-rectangular coaxial transmission lines," 2008 Proc. IEEE International Microwave Symposium, 2008.

Vanhille, K.J. et al., "Ka-band miniaturized quasi-planar high-Q resonators," IEEE Trans. Microwave Theory Tech., vol. 55, No. 6, pp. 1272-1279, Jun. 2007.

Vyas R. et al., "Liquid Crystal Polymer (LCP): The ultimate solution for low-cost RF flexible electronics and antennas," Antennas and Propagation Society, International Symposium, p. 1729-1732 (2007).

Wang, H. et al., "Design of a low integrated sub-harmonic mixer at 183GHz using European Schottky diode technology," From Proceedings of the 4th ESA workshop on Millimetre-Wave Technology and Applications, pp. 249-252, Espoo, Finland, Feb. 2006.

Wang, H. et al., "Power-amplifier modules covering 70-113 GHz using MMICs," IEEE Trans Microwave Theory and Tech., vol. 39, pp. 9-16, Jan. 2001.

Vanhille, K. 'Design and Characterization of Microfabricated Three-Dimensional Millimeter-Wave Components,' Dissertation, 2007.

Ehsan, N., "Broadband Microwave Litographic 3D Components," Dissertation 2009.

Colantonio, P., et al., "High Efficiency RF and Microwave Solid State Power Amplifiers," pp. 380-395, 2009.

Thomas, Havemann, "Overview of Interconnect," Handbook of Semiconductor Manufacturing Technology, Chapter 10, pp. 287-309 (2000).

* cited by examiner

FORMULATION FOR PACKAGING AN ELECTRONIC DEVICE AND ASSEMBLIES MADE THEREFROM

The subject matter of the present application was made with Government support from the Naval Surface Warfare Center under contract number N65538-10-M-0114. The Government may have rights to the subject matter of the present application.

FIELD OF THE INVENTION

The present invention relates generally to device packaging, and in particular to packaging materials for electronic devices and assemblies. Disclosed herein are materials for forming protected microwave device assemblies having a layer or layers; at least one of which has a low dielectric constant.

BACKGROUND

Many high end microwave assemblies are still hermetically packaged, such as transmit and receive modules for phased arrays, components for defense applications, power amplifiers, assemblies requiring chip and wire construction, high performance devices and circuit operating in the upper microwave and mm-wave bands, and so on. The reasons include ensuring reliability under environmental variations and a lack of organic or polymer protective layers that do not reduce or interfere with device performance due to factors such as dielectric loss or attenuation, or due to changing the electrical impedance of transmission lines contained in or on the device. Hermetic packaging has substantial drawbacks. The substantial cost and yield impact may be attributed to the specialized nature of the parts used in hermetic packaging, such as metal or ceramic housings, solderable or weldable lids, hermetic seals such as glass-metal seals for connectors, and the manual labor usually required for assembly and test and rework. Meanwhile, most consumer electronics traditionally operating at lower frequencies have been able to move to lower cost non-hermetic packaging through the use of protective coatings, underfill polymers, encapsulants and the like. Such approaches enable more automated batch production on large area circuit boards. Non-hermetic cavity packaging has been done in some cases; however, in environments where there is high humidity and fluctuating temperatures, condensation of water can occur inside the package. In addition, ionic contaminates such as sodium, potassium, and calcium can come from environmental sources including fingerprints, the air or salt water can penetrate many non-filled cavity structures and produce electrical reliability problems such as conductivity between circuits and/or corrosion. The problems from such condensation and ionic contaminates can be eliminated by employing polymer or silicone encapsulations over the electronics components.

Traditional approaches used to package devices for low frequency electronics do not work well on microwave devices and the circuit boards on which they are mounted because of the field interaction from the transmission lines in the circuits extend into the surrounding mediums and often extend into the encapsulants or coatings producing problems such as attenuation, changing transmission line impedance, and otherwise interfering with the function of the circuit.

A possible solution to this problem, as further disclosed herein, is the use of a very low-k layer of material, such as a syntactic foam, that does not substantially interfere with the operation of a circuit designed for operation in air or in a vacuum environment. Such a layer can be applied thick enough to minimize field interactions, for example 0.5 to 2 mm or more thick, and can be used as a "spacer layer" to an outer protective set of layers. While syntactic foams containing solid glass micro-bubbles may have the advantage of low dielectric constants, for shielding from electromagnetic interference and other phenomena, and can be made to isolate microwave devices from ionic contaminants, known materials also exhibit mismatches in the coefficients of thermal expansion among the encapsulants, substrates and electronic/microwave devices. Such mismatches can be detrimental to overall device function over the life of the device. Disclosed and claimed herein are materials that ameliorate the deficiencies of known materials.

DETAILED DESCRIPTION OF THE DRAWINGS

Figure 1:
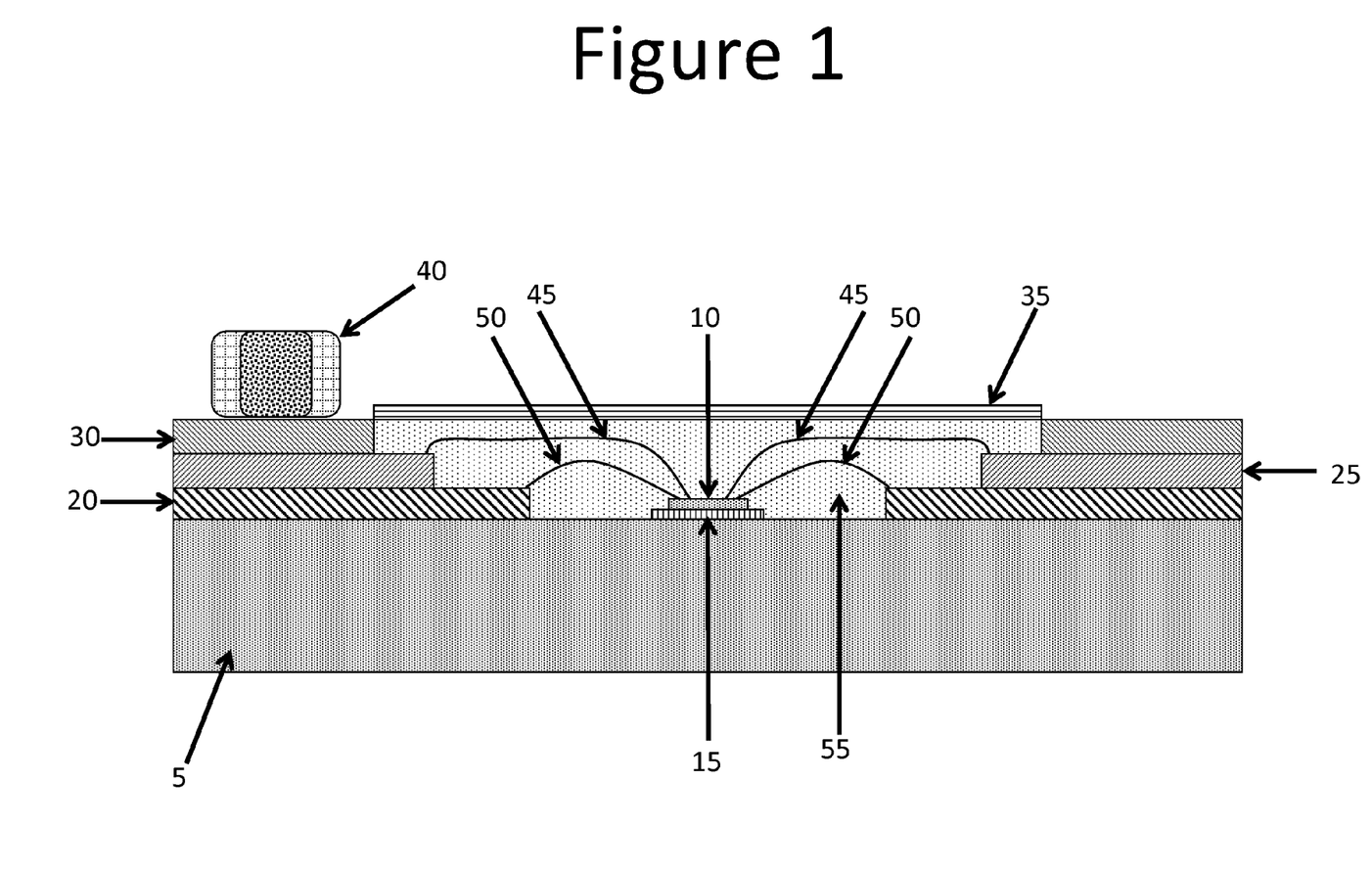
FIG. 1 illustrates a cross section of a microwave assembly, wherein a microwave device is mounted on a circuit board, in accordance with an embodiment disclosed and claimed herein.

In accordance with one aspect of the invention, FIG. 1 shows a cross section of an example microwave circuit assembly of a chip-in-board construction using a low-k syntactic foaml, wherein an active microwave device, 10, is thermally coupled to a heat spreader or CTE matching layer, 15. For small devices and in certain constructions 15, may be omitted. In this embodiment, the heat spreader and devices are mounted on a circuit board or substrate, 5. 5 may be, for example, a multi-layer circuit board, a Au/Ni plated copper substrate, a brass or Aluminum substrate, a ceramic such as Alumina or glass, a semiconductor or all or part of a wafer, or LTCC or HTCC. The thickness of 5 may typically be on the order of 0.1 mm to several mm. Also shown in this embodiment, in schematic form, are various functional layers of the microwave assembly, including layers designed to carry radio frequency (RF) signals, 20, layers designed to carry direct current (DC), 25, for example to power the active devices and other layers such as insulating layers and/or a laminated frame to surround the microwave device(s), 30. The active microwave device may be connected to the RF layer by one or more wirebonds, 50, wherein a plurality of the wires, 50, may carry the same or different signals, and to the DC layer by wires 45, wherein a plurality of wires, 45, may carry the same or different voltages. While wirebonds are shown, the device may alternatively be mounted in the recess in a flip-chip configuration onto layer 20 or 25 and the functions of 20 or 25 may be combined into one layer. In this embodiment, the active microwave device is shown covered by a layer of a syntactic foam having a low dielectric constant, 55. Such material, in the case of a syntactic foam, may be vibrationally compacted and, in the case of a fluid precursor, may be dispensed into the recess. Disposed atop the dielectric layer having a low dielectric constant may be several layers represented by 35, each of which may comprise one or more layers chosen from an electromagnetic interference (EMI) absorbing, an EMI blocking layer being electrically conductive, such as a conductive coating or metal cover, 1, one or more of an adhesive layer between layers to promote adhesion, and a thin secondary barrier such as a ALD dielectric layer. In addition, 35 may contain a sealing layer that operates as an ionic barrier layer and both the ionic barrier and the low-k material, 55, nay isolate the device from ionic contamination. Also shown in this embodiment is a representation of surface mount components, 40, which may be resistors, capacitors, surface mount active devices, integrated circuits and/or the like. Such support devices may also be located in the low-k recess with the device, 10. Not shown are connectors, wire-bondable interfaces, BGA mounting regions, and other I/O that may be present on the assembly to interconnect the assembly to a higher level circuit.

Figure 2:
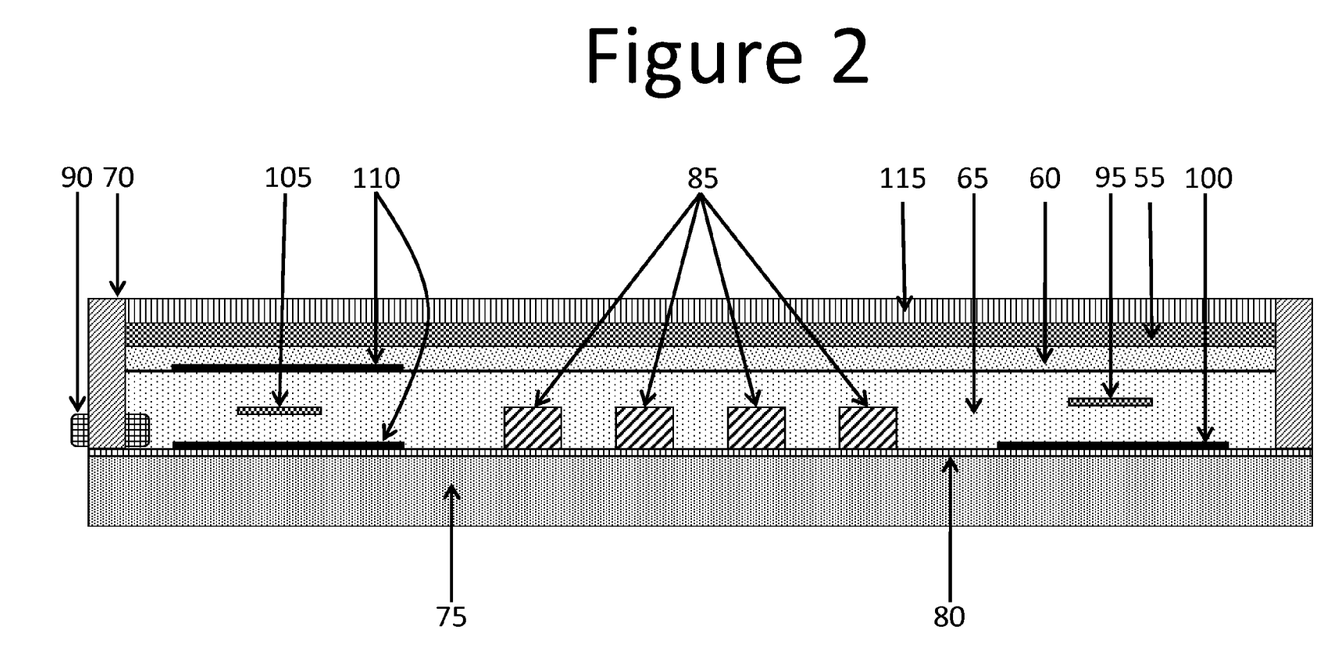
FIG. 2 illustrates a cross section of a microwave assembly, in accordance with an embodiment disclosed and claimed herein.

In accordance with another aspect of the invention, FIG. 2 shows a cross section of a microwave assembly, which includes a circuit board or substrate as described in FIG. 1, 75, optionally coated with a dielectric layer or multiple dielectric layers by atomic layer deposition (ALD) or other suitable coating method, 80. ALD may optionally be used in the example of FIG. 1. The ALD layer may serve as a secondary barrier layer to protect against corrosion and ionic contamination and/or moisture penetration in the event of permeation of the low-k syntactic foam and other coating layers and specifically protect the devices from a local failure of the primary barrier such as a pinhole or a delamination. An example of such an ALD layer would be alternating layers of zirconia and silica of 2 to 20 nm thickness applied by vapor depostion. Further illustrated in FIG. 2 are components mounted on the board, 85, a material having a low dielectric constant 65, an optional RF absorbing layer, 60, an optional conductive layer 55, and an optional ionic barrier encapsulant, 115. The circuit board may further have a metal or metallized plastic over mold, 70, around the edges or sides or around the top surface of the board and over any edge coaxial or DC connectors, 90 or around any edge connectors or interconnect structure formed of the boards metallization. Such overmolding or laminated frame can be used to create a tub structure or structures to contain one or more of the coating materials and provide containment for its dispensing. Further, the circuit board may have other passive microwave components such as microstrip electrodes, 95, disposed over a ground plane, 100, or stripline electrodes, 105, isolated between two ground planes, 110. Optional layers not shown are phenolic adhesion layers on either side of the conductive EMI blocking layer, 55, which may improve adhesion and corrosion resistance, for example when a silver-filled paint is used. Other optional layers not shown are an additional ionic sealing layer, for example an electronics grade silicone applied directly to the low-k layer, 65. The use of such layer being dependent on the materials chosen for the low-k syntactic foam material and EMI blocking layer.

DETAILED DESCRIPTION

As used herein, the conjunction "and" is intended to be inclusive and the conjunction "or" is not intended to be exclusive unless otherwise indicated. For example, the phrase "or, alternatively" is intended to be exclusive.

As used herein, the term "dielectric" refers to an electrically insulating material having an electrical conductivity less than about $10^{-10}$ Siemens per meter. Further characterizing a dielectric is the dielectric constant, defined by the permittivity of the substance divided by the permittivity of free space.

Spatially relative terms such as "under", "below", "lower", "over", "upper", "on" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc and are also not intended to be limiting.

As used herein, when referring to microwave devices and microwave frequencies, we intend for the term "microwave" to be used in its broadest sense to include all devices and frequencies from RF to sub-millimeter wave.

Disclosed herein is a formulation for forming a cured matrix, comprising: one or more matrix precursors capable of being cured; hollow glass bubbles; wherein the hollow glass bubbles are present in an amount sufficient to form a cured matrix having a dielectric constant less than 2.0, and wherein at least 10% (vol/vol) of the hollow glass bubbles have an outer dimension less than or equal to about 15 micrometers.

Further disclosed herein is a microwave assembly comprising: a microwave circuit comprising at least one microwave transmission line; a dielectric layer formed by applying the formulation disclosed supra to form a precursor coating over the microwave circuit, and curing the precursor coating; and at least one electromagnetic interference blocking layer over the dielectric coating.

Still further disclosed herein is a formulation for forming a shielding layer, comprising: one or more matrix precursors capable of being cured; hollow glass bubbles, coated with a conductor; wherein the conductor comprises one or more metals chosen from silver, gold, copper, palladium, platinum, nickel, iron, cobalt, manganese, vanadium, samarium, neodymium, indium, oxides thereof or combinations thereof, and wherein at least 10% (vol/vol) of the hollow glass bubbles, coated with a conductor, have an outer dimension less than or equal to about 20 micrometers.

Still further disclosed herein is a microwave assembly comprising: a microwave circuit comprising at least one microwave transmission line; at least one dielectric layer having a dielectric constant between about 1.01 and about 2.00 over the microwave circuit; and at least one shielding layer formed by applying the formulation, described in the preceding paragraph to form a precursor coating over the dielectric layer, and curing the precursor coating.

Still further disclosed herein is a formulation for forming a shielding layer, comprising: one or more matrix precursors capable of being cured; hollow glass bubbles; conducting, semiconducting or magnetic materials chosen from, metal nanowires, semiconducting nanowires, magnetic nanomaterials, or chiral conductors; wherein at least 10% (vol/vol) of the hollow glass bubbles, coated with a conductor, have an outer dimension less than or equal to about 15 micrometers.

Still further disclosed herein is a microwave assembly comprising: a microwave circuit comprising at least one microwave transmission line; at least one dielectric layer having a dielectric constant between about 1.01 and about 2.00 over the microwave circuit; and at least one shielding layer formed by applying the formulation of the preceding paragraph to form a precursor coating over the dielectric layer, and curing the precursor coating.

Further disclosed herein is a protected device or assembly containing a microwave transmission line structure. The protected apparatus may include a substrate with a microwave device or transmission line and/or may include a die. Protection is provided by a low-k cured matrix, made using the formulation described supra, said cured matrix having an exemplary dielectric constant less than 2.0 and, as a further example, having an exemplary dielectric constant between 1.2 and 1.6. The dielectric layer is applied such that it has a a thickness of between about 0.05 mm and about 5 mm. The selected thickness will be based on the distance from the transmission lines that the fields producing interactions and such that the low-k layer is thick enough to contain said fields to an extent that any subsequent layer does not substantially degrade the performance of the device or assembly.

One or more ionic barrier layers may be applied over the dielectric layer. An ionic barrier layer, for example electronics grade silicone, is disposed on the surface of the low-k material and is of a thickness from 0.025 mm to several mm and sufficiently thick to ensure there are no holes in the material. The ionic barrier layer(s) function to substantially prevent the penetration of water vapor such that the permeation does not interfere with the operation of the device or assembly within its operating parameters over its operating lifetime and to substantially slow the ingress of ions such as sodium ions, potassium ions, chloride ions and the like. Other layers which can provide additional protection and serve other functions depending on the device or assembly being protected include: one or more EMI blocking layers, one or more EMI absorbing layers, and/or one or more layers of a thin dielectric applied on the device or assembly by aerosol, atomic layer deposition, ionic self-assembly monolayer or another thin film deposition process. The coating of this secondary thin dielectric layer must be relatively conformal and be applied in a sufficiently thin layer to not impact the device operation in a deleterious manner. Functions of layers may be combined. For example, the ionic barrier layer(s) may also have properties that allow it to block or absorb EMI, as may be the case for conductive or resistive particles in a silicone binder.

Further disclosed to the above structures are adhesion promoting layers or barrier layers which may be used between layers if the layers themselves do not adhere well or may be reactive between them. For example, silver containing conductive paints serving as EMI blocking layers may not adhere well to silicone layers serving as moisture and ionic blocking layers. An adhesion promoting layer such as a phenolic resin may be applied between the layers. All layers in this case may be applied for example by brushing, spraying, and/or casting.

In accordance with the above, microwave devices can be active or passive. Active microwave devices are designed to operate at frequencies between about 300 MHz and about 300 GHz or more and include, without limitation, monolithic microwave integrated circuits (MMICs) and devices comprising discrete transistors or diodes. Such devices may be formed in silicon or other semiconductor materials such as Gallium Arsenide, Germanium, Silicon/Germanium, Indium Phosphide, Gallium Nitride or other semiconductor materials. Functionally, active microwave devices include, without limitation amplifers, transistors, equalizers, integrated circuits, rectifiers, and the like. Passive microwave devices include, without limitation, isolated electrodes such as microstrip waveguides, coplanar waveguides as well as hollow waveguides, resonators, filters, and delay lines but do not comprise layers between antennas. Moreover, the microwave assembly may contain non microwave components for power conditioning, interfacing and the like. In addition, microwave components can be made with normal metals or with superconductors. While normal metal technology is more mature, superconductive components often exhibit advantages in size, speed, and signal fidelity.

Materials having low dielectric constants of less than about 2.0, referred to generally herein as "low-k materials" include aerogels, syntactic foams, expanded foams, materials formed from the decomposition of porogens and the like. The dielectric constant of a porous low-k material depends on the degree of porosity. Generally, the more porous the material, the lower the dielectric constant. However, other factors may affect the dielectric constant such as the presence of solvent impurities, moisture, and ionic materials such as salts, acids and bases and the nonuniformity of the porous low-k material. Accordingly, in one example, dielectric constants may be between 1 and about 1.7. In another example, dielectric constants may be between 1 and about 1.5. In still another example the dielectric constant of a given porous low-k material may be between 1 and about 1.46.

Aerogels describe a class of material based upon a low density, open cell structure with large surface areas (often 900 $m^2/g$ or higher) and nanometer scale pore sizes of about 5 nm to about 50 nm. A variety of different aerogel compositions are known. These may be inorganic, organic and inorganic/organic hybrids (see N. Hüsing and U Schubert, Angew. Chem. Int. Ed. 1998, 37, 22-45). Inorganic aerogels are generally based upon metal alkoxides and include materials such as silica, carbides, and alumina. Organic aerogels include, but are not limited to, urethane aerogels, resorcinol formaldehyde aerogels, and polyimide aerogels. Organic/inorganic hybrid aerogel were mainly organically modified silicate (organically modified silica or "ormosil"). In these materials, the organic and inorganic phases are chemically bonded to each other. Methods of making silica aerogels having low dielectric constants are described infra.

Silica aerogels are formed from sols. Silica ($SiO_2$) sol may be prepared by a two-step process involving acid and base catalysts with tetraethoxysilane (TEOS) as a precursor and isopropyl alcohol (IPA) as a solvent with the sol composition of; $TEOS:H_2O:NH_4OH:HCl:IPA=1.0:4.0:8.2\times10^{-3}:1.8\times10^{-4}:3.0$ in molar ratio. This sol is spin-deposited on the desired substrate using a commercial photoresist spinner in the optimized viscosity range at a spin rate of 2000 to 7000 rpm, depending on the desired thickness. Spin deposition is conducted under an atmosphere saturated with IPA to minimize solvent evaporation from the $SiO_2$ gel. The substrate with the spun-on film is then immersed in IPA and placed in an autoclave at 450° C. and annealed under vacuum for 2 hours.

Other methods of making aerogels are known in the art. For example, in U.S. Pat. No. 6,380,105, Smith et al. describe the following method: In a 500 ml flask are combined, 61.0 ml (0.275 mol) tetraethoxysilane (TEOS), 61.0 ml (0.835 mol) glycerol, 4.87 ml (0.27 mol) water, and 0.2 ml ($2.04\times10^{-4}$ mol) of 1 M $HNO_3$. The mixture is then refluxed for 1.5 hours at 60° C. to form a stock solution. After cooling, the solution may be diluted with ethanol to reduce its viscosity. One suitable stock solution: solvent volume ratio is 1:8. However, this ratio will depend upon desired film thickness, spin speed, and substrate. This is mixed vigorously and typically stored in a refrigerator at 7° C. to maintain stability until use. The solution is warmed to room temperature prior to film deposition.

To produce a film, 3-5 ml of the above precursor sol are dispensed at room temperature onto the substrate, which is then spun between 1500 and 7000 rpm (depending on desired film thickness) for about 5-10 seconds to form sol thin film. During and after this deposition and spinning, the ethanol (from the decomposition of TEOS), water, and the nitric acid are evaporating from film, but due to glycerol's low volatility, no substantial evaporation of the glycerol occurs. This evaporation also shrinks thin film and concentrates the silica content of the sol, forming a film of reduced thickness film shows a reduced thickness sol film obtained after substantially all (about 95% or more) of the ethanol has been removed.

The ratio of silica to fluid can be derived approximately from the TEOS to glycerol ratio in the as-deposited sol (with minor changes due to remaining water, continued reactions and incidental evaporation). As this method largely prevents the gel from permanently collapsing, this ratio determines the density of the aerogel film that will be produced from the sol thin film. Aging is accomplished by allowing the substrate and gel to sit for approximately 24 hours at about 25° C. or by heating it to 130-150° C. for about 1 minute in a closed container.

To form a film of lower dielectric constant, the aged film may be dried without substantial densification by using solvent exchange to replace the aging fluid (glycerin) with a drying fluid and then air drying the film. The first step replaces the aging fluid with an intermediate by dispensing approximately 3-8 mL of ethanol at room temperature onto aged thin film and spinning the wafer between approximately 50 and 500 rpm for about 5-10 seconds. This step is repeated several times as required to eliminate the aging fluid. The second step replaces ethanol with a drying fluid such as heptane. This step comprises dispensing approximately 3-8 mL of heptane at room temperature onto aged thin film. The wafer is spun at approximately 50 to 500 rpm for about 5 to about 10 seconds. This step is repeated several times as required to eliminate the ethanol. The heptane is allowed to evaporate from the wet gel, forming a dry nanoporous dielectric. Alternatively, the wet gel can be dried directly from ethanol. After room temperature drying to remove most of the ethanol (or heptane), the film is baked in a convection oven at 300° C. for 15 to 60 minutes to remove any residual materials. The theoretical dielectric constant (before surface modification) of this embodiment is estimated to be about 1.3.

Syntactic foams are composite sparse materials synthesized by filling a metal, polymer or ceramic matrix with hollow particles called microbubbles or microballoons. The presence of hollow particles results in low density and a low dielectric constant. These materials can be tailored to a given application by selecting from almost any metal, polymer or ceramic. A wide variety of microbubbles are known, including cenospheres, glass microspheres, and carbon and polymer microbubbles. The most widely used and studied foams are glass microbubble-epoxy, glass microbubble-phenolic, glass microbubble-polystyrene, glass microbubble-polyurethane glass microbubble-polysilsesquioxane and the like. Glass microbubbles can be formulated into solutions of virtually any polymer binder material.

Glass microbubbles include ECCOSPHERES® available from Trelleborg Offshore Boston, Inc. Glass microbubbles are also available from the 3M company of St. Paul, Minn. Materials with a suitable size distribution may include 3M® iM30K, 3M® XLD3000, 3M® XLD6000, 3M® K42HS, and 3M® S60HS. The microbubbles may be surface treated with a variety of adhesion promoters and coupling agents, including, without limitation, silanes, siloxanes, silazanes, and silylation agents such as hexamethyldisilazane, gamma-aminopropyl triethoxysilane, and the like. While the glass microbubbles may be nearly spherical, it is understood that they may, in some circumstances, have a generally oblong or ellipsoidal shape having a larger and a smaller dimension. In the former case, we may refer to the outer diameter or the outer dimension interchangeably while in the latter case, we refer to the smaller of the two dimensions.

The size dispersity of a population of microbubbles appears to play a role in the properties of the syntactic foam made therefrom, particularly, the thermal properties. For example, a polydisperse population of glass microbubbles having a distribution such that at least 10% (vol/vol) of the hollow glass bubbles have an outer dimension less than or equal to about 15-20 micrometers appears to impart more thermal stability to the cured matrix. In addition, the polydisperse population of glass microbubbles having a distribution such that at least 90% (vol/vol) of the hollow glass bubbles have an outer dimension that is less than or equal to about 55-60 micrometers may also have advantages. Without intending to be bound by theory, it is believed that the small microbubbles in the population impede the flow of the matrix material during thermal cycling; thus preventing cracking.

In addition, glass particles coated with a conductor may grow in size commensurate with the thickness of the conductor coating. Accordingly, the coated glass microspheres are described herein as having a slightly larger dimension.

The glass microbubbles may also be subjected to metal deposition using chemical vapor deposition, evaporation, sputtering, atomic layer deposition electroless plating or any other suitable deposition method. For electromagnetic shielding purposes, the type of metal or alloy may depend on the application and desired properties. For example, for electromagnetic shielding, applications, silver, gold, copper, palladium, platinum, nickel, indium, oxides, heterogeneous composites or alloys thereof may be useful. Together, heterogeneous composites and alloys are termed, "combinations." In applications where a magnetic metal is desired, the list above may, without limitation, further include iron, cobalt, manganese, vanadium, samarium, and neodymium, indium, oxides thereof or combinations thereof.

Expanded foams can comprise various polymers, including, without limitation, polystyrene, polyethylene, polyurethane, polypropylene polysilsesquioxane and the like. Several formulations capable of producing cured expanded foams are commercially available, for example TAP X-3®, available from Tap Plastics incorporated.

Matrix materials such as organic and silicon containing polymers such as silsesquioxanes may have their dielectric constants lowered by using porogens. Usually, porogens are nanometer-sized polymer materials, formed as particles, that decompose upon heating, leaving a pore in the matrix material. Commercially available porogen containing materials have dielectric constants of 3 or less. However, one commercially available material is LKD-6103®, available from JSR-Micro Inc., with a dielectric constant of about 1.91.

However, depending on the desired application, thermosetting, cationic curing, epoxy or other elastomers may, without limitation, be suitable. Among these are thermosetting silicones, including silicone elastomer materials such as Sylgard® 182, Sylgard® 184, Dow Corning® 3-6121, Dow Corning® 93-500 Space Grade Encapsulant, Dow Corning® SE 1740, and Dow Corning® Q1-4939, available from the Dow Corning® company of Midland, Mich. Further materials, without limitation may include, VicoSil 139DLK-CL®, available from Vicone, of St-Eustache, Quebec, LSR2030™, LSR2040™, LSR2050™, LSR2630™, LSR2640™, LSR2650™, and LIM6030™, available from Momentive Performance Materials Company. Other suitable polymer materials include, without limitation, Epoxy elastomer materials, available from Masterbond company, and thermosetting fluoroelastomer compounds, available from DuPont corporation.

The cured hardness of a thermosetting material is frequently measured using a Durometer on the Shore hardness scale. For example, Dow Corning® SE 1740, when cured according to manufacturer's instructions, exhibits a Shore A hardness of 35, while Dow Corning® Silgard 182 Silicone Elastomer exhibits a Shore A hardness of 51, when cured according to manufacturer's instructions. The elastic modulus of the bulk film, without additives, is also a useful parameter. Without intending to be bound by theory, the elastic modulus of a cured material may be estimated from the Shore A hardness to within about 6-10% (Kunz et al., "Determining the Modulus of Elasticity in Compression via the Shore A Hardness," Kunststoffe June 2006, pp. 92-94) using the equation $$E = \frac{1-\mu^2}{2 \cdot R \cdot C_3} \cdot \frac{C_1 + C_2 \cdot Sh_A}{100 - Sh_A} \cdot (2.6 - 0.02 \cdot Sh_A)$$

Where the elastic modulus, E is in MPa (N/mm$^2$), $\mu$ is Poisson's ratio, taken to be 0.5, R=0.395 mm, $C_1$=0.549 N, $C_2$=0.07516 N and $C_3$=0.025 mm, and $Sh_A$ is the Shore A hardness.

Ionic barriers may be comprised for example of one or more of an electronics grade silicone, a parylene, a polyimide, and/or a curable BCB resin. The low-k layers may be comprised of one or more of a syntactic foam, an expanded foam, and aerogel, and/or a highly porous material formed from a composite material and optionally containing or comprising a porogen.

EMI blocking layers are differentiated from EMI absorbing layers in the blocking layers having a conductive property whereas the absorbing layers have an attenuating property through a thickness and do not substantially produce a reflection at their surface in comparison to a blocking layer. EMI blocking layers may be a metal lid or cover, a metallized plastic lid or cover, a conductive paint, a sputtered or evaporated coating, or a conductive coating deposited from a liquid such as a electroless metal coating. Such conductive coatings or paints may contain one or more of silver, gold, copper, or platinum or may be comprised of a conductive polymer or plastic material. EMI attenuating layers serve as absorbers to prevent resonances and reflections inside the cavity formed by the low-k layer and may be comprised of one or more of a resistive film, a resistive coating, a ferrite and/or carbon filled silicone, an iron containing compound, a carbon nanotube composite, or any electric field and/or magnetic field attenuating material which may be cohesively held in a binder or support matrix as a silicone, urethane, or epoxy.

Other layers may be applied on or over the low-k material. For example, a metal lid or metallized plastic cover or case may be used to cover portions of the circuit. Further, a metallic or conductive coating, such as a silver filled paint can be used to introduce electromagnetic interference (EMI) shielding to the circuit. In some cases, such a metal lid or coating may produce a resonant cavity when combined with the low-k coating. Further, a microwave absorbing layer may be used either in conjunction with the EMI shield between it and the low-k layer to reduce resonance or in place of the EMI shield in circumstances where interference with the outside environment or adjacent circuits is negligible. This absorbing layer may be a resistive film or coating such as a resistive metal layer, a composite material such as a carbon filled foam or carbon filled polymer. For example, a carbon or ferrite-filled silicone disposed over the low-k layer may serve as an absorber to suppress cavity modes in the low-k cavity region. It may be comprised of a magnetic material or ferrite or ferrite powder. It may be comprised of a combination of electrically and magnetically lossy materials at the frequencies that need to be attenuated in the circuit. The absorber coating may be used in conjunction with a conductive or resistive coating or metal case to further suppress EMI. Other microwave absorbing materials may be formulated with a binder polymer or foam material, such ground ferrites absorbing ceramics or other resistive materials. Such materials may be integrated into a silicone to provide a ionic barrier. Suppressing EMI may further be accomplished by mechanical design of the encapsulant, for example, by selecting a geometry that eliminates or modifies resonant effects to ensure they occur at frequencies that do not interfere with circuit operation. For example, forming, imprinting, molding, or stamping a pattern into the low-k material, the absorber material or the conductive or resistive coating may be used to diminish resonance in a given interfering frequency range or change the resonant frequency so that it is outside the interfering frequency range. As a particular example, stamping a series of pyramids into the surface of the low-k material, and then applying the absorber material may be used to reduce the Q-factor, or reciprocal of the loss tangent, characteristic of the interfering frequency, or move it out of band. Yet another design approach is to partition a particular area containing multiple circuits into a series of smaller areas, or vice versa, to avoid interfering frequencies or move resonances out of the bands of interest.

Protection layers for the low-k materials and for the microwave devices may be used to improve the robustness of the overall package. Atomic layer deposition can be used to deposit materials or nano-layer composites such as TiO2, Al2O3, SiO2, ZrO2 and combinations thereof or other materials may be used to protect active and passive microwave devices from moisture or other chemical attack. These coatings may be used in the approach disclosed herein. Such coatings may be applied to sensitive components before mounting or may be applied to the circuits after assembly. However, these coatings alone may be relatively thin or may not substantially prevent the field interaction issues presented supra. Condensation of moisture or contaminants on an active or passive microwave device, for example, can reduce the desired circuit performance in a non-hermetic package. Thus such protection layers are complementary to other approaches described herein. The low-k material can also be protected with overcoatings such as the absorber, conducting layers, or by sealing the low-k material in vapor deposited materials such as a paralene vapor deposited layer.

Before application of the coatings, a cleaning process can be used to create a clean ionic free environment beneath the ionic barrier layer disposed over the low-k material ensuring the low-k filled cavity produced under the barrier layer is free of contaminants. This cleaning process typically will involve a rinse in 18 mega-ohm resistance DI water and performed until the rinse water achieves an equivalently high 18 mega-ohm resistivity endpoint as can be monitored using a conductivity meter in the rinse water path. This or a similar cleaning process to ensure all salts and other ionic contaminates are removed before sealing the components under an ionic blocking layers such as electronics grade silicone is necessary to ensure such contaminants don't interfere with device performance or reliability though changes in conductivity between transmission lines or device corrosion. Additional cleaning steps may be utilized such as plasma cleaning in an argon oxygen plasma, where such plasma cleaning can promote adhesion of the layers being applied by eliminating hydrocarbons and activating the exposed surfaces.

In another embodiment, the device or assembly may be coated in a secondary barrier applied directly on the device, assembly, circuit-board or housing and may consist of a ALD (atomic layer deposition) coating of 20 alterating zirconia and alumina nanolayers of 5 nm each which serves as a secondary protection. This may be followed by layer of Eccostock FFP syntactic foam made by Emerson and Cumming and applied to a thickness of 0.5 to 7 mm depending on the frequency of operation and structures being coated and for example may be 2 mm thick on a 10 GHz circuit containing PWB, MMICs and wirebonds. The foam may be compacted using a vibration table and then baked at 120 C for an hour in air or as necessary to fuse the coatings on the syntactic foam. Next a 0.5 mm thick electronics grade silicone may be applied directly to the syntactic foam and baked. This can be followed by an acid resistant solder mask applied to approximately 25 microns thickness and baked to provide both a layer of protection and adhesion for a subsequent conductive silver paint, also applied by a painting process to approximately 25 microns thickness and which serves as a EMI blocking or shielding layer. The coating is baked to dry and cure it. The EMI shielding layer is prepared in a way to ensure it is in electrical contact with the ground plane of the circuits or device at one or more locations around the perimeter of the syntactic foam. A second adhesion layer (the acid resistant solder mask) is next applied and cured by baking and then a final additional ionic and moisture barrier, such as silicone, is applied at a thickness of 0.5 mm thickness and baked until cured at 120 C for an hour or according to the manufacturer's directions.

In the context of mass transport, permeability is defined as the product of solubility and the coefficient of diffusion. Hence, polymer coatings are known that are hydrophobic and thus impermeable to water but permeable to ionic species. Further, polymer materials are known that are both hydrophobic and ion impermeable. Ionic species comprise cations and anions. Cations include, without limitation, lithium, sodium, potassium, cesium, magnesium, calcium, cupric, cuprous, ferric, and ferrous ions. Anions include, without limitation, the halides such as fluorides, chlorides, bromides and iodides as well as hydroxides, nitrates, sulfates, acetates and the like.

Examples of water impermeable but ion permeable polymer materials include ion porous polytetrafluoroethylene film (PTFE-commonly known as Teflon® or Fluon®, marketed as Tetratex® or Gore Fabric®) as well as water swellable polyurethane or polyurethane/polyol copolymer, for example, Scotch-Seal Chemical Grout 5610, manufactured by 3M Corporation, or a water soluble polyacrylamide Cyanagel 2000, available from CYTEC Technology Corporation. Examples of polymers that are both water impermeable and ion impermeable include, without limitation, Amorphous copolymers of PTFE and perfluoro (2,2-dimethyl-1,3-dioxaole), available from DuPont, polychlorofluoropolymers, available from Aclon, olynorbornenes, polyphenylenes, silicones, and parylenes. Thus, to enable a reliable non-hermetic package using a low-k materials a sealing layer containing both properties of being an ionic barrier and a moisture barrier are important to providing a primary protective coating to the circuits.

Application of these approaches may be used for packaging chips where a microwave capable lead-frame or a package such as a quad-flat-no lead (QFN) package is used. The methods described herein may advantageously be used, instead of using the more expensive and difficult hermetic or semi-hermetic packages, because it is difficult to package a device in such a way that one obtains a hermetic bond between different materials such as plastics and metals that prevents diffusion of gasses or moisture through seals, adhesive layers, and plastics.

Circuit boards used in microwave assemblies may include several features such as recessed topographies on the upper and lower surfaces, embedded passive devices, ground planes, metal cladding and heat spreaders mounted on the board to accommodate heat generating devices, particularly active microwave devices.

It may be desirable to employ heat spreaders to dissipate heat generated by various microwave devices. Heat spreaders comprise thermally conductive materials. Such thermally conductive materials may include, without limitation, silver filled, metal filled, ceramic filled materials or thermally conductive epoxies and thermally reworkable adhesives, such as those available from AIT Technology, Masterbond, or Diemat. For example, Diemat has a thermal conductivity of 17 W/mK in a reworkable thermoplastic/thermoset material 4130HT and has indicated that materials of 25 W/mK are available for sampling as well as 6030 H, which has a thermal conductivity of 75 W/mK. This approach allows the use of heat-spreaders having thermal expansion coefficients that are more closely matched to the die, for example Cu/Mo, Cu W, synthetic diamond, and laminates thereof.

Advantages of having a metal clad board may also include enabling the bonding of the board directly to a secondary heat sink, which for high power applications may be passively air cooled, forced air cooled, liquid cooled, or cooled by refrigerant. Such a heat sink may be mechanically clamped or permanently bonded with a thermally conductive adhesive or solder, or cooling channels may be directly created in the metal of the board if it is suitably thick.

Portions of the circuit board upper and lower surfaces may be recessed, for example as illustrated on the top surface in FIG. 1. Such topography may enable a controlled volume of low-k material to be used and for it to be confined on its sides to provide mechanical forming and structural support Further, a recessed topography can reduce profile, or provide a direct thermal path for dissipating heat generated by a device. Notwithstanding the foregoing, mounting on a top surface of a board may also be used, for example, when there is limited heat generated, such as in a diode or low noise amplifier or when fabrication simplicity is desired. Alternatively thermal vias may be used to heat-sink devices mounted on dielectric layers on a boards surface. In such cases where a low-k material is to be used on upper board surface or where a low-k material is used to mold around a device or circuit on one or more surfaces a die or mold may be used to compress or form the low-k material into a desired shape. The material may be deposited and then molded or may be injected into the die or mold at the time the mold or die is placed on or over or around the circuit to be coated.

The methods described herein enable non-hermetic circuit-boards to replace hermetic modules. For example, in FIG. 1, a microwave device such as a GaN microwave die may be bonded to a heat-spreader, mounted in a stamped or cut or machined pocket on a microwave circuit board. The use of metal backed boards may further provide a heat sinking function as well as mechanical rigidity and strength. Non-hermetic connectors may be attached to such a board and/or interconnect may be fed under one or more layer to a second recessed periphery area of the board for wirebonding. Board substrates with copper, brass, or aluminum backings are available from, for example, Taconic and Rodgers Corporation. Where minimized weight or cost is desired, one or more metal slugs or thermal vias may be used in a non-metal clad board. Microwave devices may be interconnected on a circuit board using wire-bonds, surface mounting, microwave jumpers or beam-leads in design configurations known to reduce parasitic effects.

According to the instant approaches, substantially all traditional board mounting options are preserved. These include mounting technologies for multi-layer boards, surface mount, and through-hole techniques, where the metal backing is removed or is not present. Such boards may use thin film or laminated sheet resistor or capacitor materials, such as those available from DuPont.

Rework of boards after low-k material and one or more ionic barrier sealing layers is applied can be accomplished by any process that suitably removes coatings. For example, some materials can be removed mechanically while other polymer materials, particularly those that have not been cross-linked, can be removed by solvent dissolution. Certain cross-linked materials may be removed using solvents that swell and delaminate the coating. However, coatings such as densely cross-linked epoxy materials may require an oxygen plasma strip. Moreover, inorganic filled materials may require further stripping with an etch chemistry that attacks the inorganic substance. For example, silica microbubble composites may require a fluorine plasma or an HF wet strip either alone or in conjunction with any of the foregoing. Alternatively a oxygen containing plasma etch may be used to remove the binders from a syntactic foam and the device may be placed in an inverted manner to accelerate removal of glass microballons. Alternatively, brief contact with buffered hydrofluoric acid can be used to remove silica based aerogel. Re-routing of the pocket mechanically may be accomplished to provide a fresh surface of the heat-sink layer. The applicable techniques may be used according to materials in use. In another rework approach, one or more primary barriers may be cut away with a razor and peeled away and the syntactic foam may be oxygen plasma ashed to remove its binder. A secondary protection layer such as an ALD coating may typically be thin enough to allow wirebonding through it and reworkable conductive adhesvies or solders can allow chip or mounted devices to be detached and re-attached. The non-hermetic sealing steps can then be applied a second time.

In addition to reducing production costs, the approach disclosed herein also enables the production of relatively large sheets containing an array of devices to be produced or assembled at one time. These can later be divided into separate devices, or can be used in strips, or 2-D arrays for applications such as phased arrays.

Example 1

Dow Corning Q1-4939™ resin and accompanying hardener were blended in a weight ratio of 2:1, respectively, to form a thermoset elastomer precursor, applied to a silicon substrate at a thickness of 1 mm and cured in a 150° C. oven for 1 hour. The resulting thermoset elastomer gave a Shore A hardness of 30.

Example 2

The uncured blend from Example 1 was combined with a monodisperse sample of glass microbubbles having an outer dimension of 25-30 micrometers at a weight ratio of 7:3 microbubbles:precursor. The resulting mixture was cycled through several vacuum pump and purge cycles to remove any trapped air and applied to a silicon wafer at a thickness of about 1 mm. The resulting workpiece was cured as above. After curing, and rapid thermal cycling between −60° C. and +160° cracks were observed in the deposited film and the cured resin was observed to exude out of the side of the cracks.

Example 3

A sample was prepared according to Example 2 but with a polydisperse sample of microbubbles, 3M™ iM30K, having a distribution such that 10% (vol/vol) (volume ratio) of the hollow glass bubbles had an outer dimension that was less than or equal to 9 micrometers, and the cure was in a 200° C. oven for one hour. After rapid thermal cycling between −60° C. and +160° as in Example 2, no cracks were observed in the deposited film.

Although the present invention has been shown and described with reference to particular examples, various changes and modifications which are evident to persons skilled in the art to which the invention pertains are deemed to lie within the spirit, scope and contemplation of the invention.

What is claimed is:

1. A microwave assembly comprising:
   a. a microwave circuit comprising at least one microwave transmission line; and
   b. a dielectric layer disposed over the microwave circuit, the dielectric layer comprising one or more cured matrix precursors and hollow glass bubbles, the hollow glass bubbles present in an amount sufficient to form a matrix having a dielectric constant less than about 2.0, and having a polydisperse population of glass microbubbles, wherein a first population has at least 10% (vol/vol) of the hollow glass bubbles having an outer dimension less than or equal to about 15 micrometers and wherein a second population of the hollow glass bubbles has an outer dimension that is equal to about 60 micrometers.

2. The microwave assembly according to claim 1, comprising at least one electromagnetic interference blocking layer disposed over the dielectric coating.

* * * * *